(12) United States Patent
Anderson et al.

(10) Patent No.: US 7,692,271 B2
(45) Date of Patent: Apr. 6, 2010

(54) DIFFERENTIAL JUNCTION VARACTOR

(75) Inventors: Frederick Gustav Anderson, South Burlington, VT (US); Robert Mark Rassel, Colchester, VT (US); Nicholas Theodore Schmidt, Colchester, VT (US); Xudong Wang, Groton, MA (US)

(73) Assignee: International Business Machines Corporation, Armonk, NY (US)

( * ) Notice: Subject to any disclaimer, the term of this patent is extended or adjusted under 35 U.S.C. 154(b) by 368 days.

(21) Appl. No.: 11/679,987

(22) Filed: Feb. 28, 2007

(65) Prior Publication Data

US 2008/0203537 A1 Aug. 28, 2008

(51) Int. Cl.
H01L 29/93 (2006.01)

(52) U.S. Cl. .............. 257/601; 257/E29.344; 438/379

(58) Field of Classification Search ........... 257/601, 257/E29.344; 438/379
See application file for complete search history.

(56) References Cited

U.S. PATENT DOCUMENTS

| | | | |
|---|---|---|---|
| 3,657,609 A * | 4/1972 | Oswald et al. | 257/601 |
| 6,521,506 B1 | 2/2003 | Coolbaugh et al. | |
| 6,878,983 B2 | 4/2005 | Coolbaugh et al. | |
| 6,891,251 B2 | 5/2005 | Coolbaugh et al. | |
| 7,025,615 B2 | 4/2006 | Johansson et al. | |
| 2005/0224917 A1* | 10/2005 | Gau | 257/598 |
| 2006/0145300 A1 | 7/2006 | Coolbaugh et al. | |

FOREIGN PATENT DOCUMENTS

| | | | |
|---|---|---|---|
| EP | 1139434 A2 | 10/2001 | |
| JP | 59127408 A | 7/1984 | |
| WO | WO 03063255 A1 | 7/2003 | |

OTHER PUBLICATIONS

Gutierrez, et al.; PN Junction Integrated Varactors for RF Applications at Different Standard Frequencies; pp. 118-121, 2003.

* cited by examiner

*Primary Examiner*—Mark Prenty
(74) *Attorney, Agent, or Firm*—Schmeiser, Olsen & Watts; Anthony J. Canale

(57) ABSTRACT

Structure and methods for a differential junction varactor. The structure includes: a silicon first region formed in a silicon substrate, the first region of a first dopant type; and a plurality of silicon second regions in physical and electrical contact with the first region, the plurality of second regions spaced apart and not in physical contact with each other, the plurality of second regions of a second dopant type, the first dopant type different from the second dopant type; a cathode terminal electrically connected to the first region; a first anode terminal electrically connected to a first set of second regions of the plurality of second regions; and a second anode terminal electrically connected to a second set of second silicon regions of the plurality of second regions, second regions of the first set of second regions alternating with second regions of the second set of second regions.

26 Claims, 12 Drawing Sheets

DIFFERENTIAL JUNCTION VARACTOR

FIELD OF THE INVENTION

The present invention relates to the field of semiconductor devices; more specifically, it relates to differential junction varactor structures.

BACKGROUND OF THE INVENTION

Junction varactors (or diode based varactors) find wide use in integrated circuits. Varactors are primarily used as voltage-controlled capacitors in such devices such as parametric amplifiers, parametric oscillators and voltage controlled oscillators in circuits such as phase-locked loops and frequency synthesizers. However, when differential varactors (e.g. two anodes) are required, two conventional varactors are wired together differentially (each anode is wired separately and the cathodes are wired together) which consumes significant integrated circuit chip area. Accordingly, there exists a need in the art to overcome the deficiencies and limitations described hereinabove.

SUMMARY OF THE INVENTION

A first aspect of the present invention is a junction varactor, comprising: a single first silicon region formed in a silicon substrate, the first silicon region of a first dopant type; and a plurality of second silicon regions in physical and electrical contact with the first silicon region, the plurality of second silicon regions spaced apart and not in physical contact with each other, the plurality of second silicon regions of a second dopant type, the first dopant type different from the second dopant type; a cathode terminal electrically connected to said first silicon region; a first anode terminal electrically connected to a first set of second silicon regions of said plurality of second silicon regions; and a second anode terminal electrically connected to a second set of second silicon regions of the plurality of second silicon regions, second silicon regions of the first set of second silicon regions alternating with second silicon regions of the second set of second silicon regions.

A second aspect of the present invention is a junction varactor, comprising: a first silicon region formed in a silicon substrate, the first silicon region of a first dopant type; a plurality of second silicon regions formed in the first silicon region, adjacent second silicon regions of the plurality of second silicon regions separated from each other by dielectric isolation formed in the first silicon region, the plurality of second silicon regions of a second dopant type, the first dopant type different from the second dopant type, the dielectric isolation extending into the first silicon region from a top surface of the substrate a first distance and the plurality of second silicon regions extending into the first silicon region from the top surface of the substrate a second distance, the first distance greater than the second distance; a cathode terminal electrically connected to said first silicon region; a first anode terminal electrically connected to a first set of second silicon regions of said plurality of second silicon regions; and a second anode terminal electrically connected to a second set of second silicon regions of the plurality of second silicon regions, second silicon regions of the first set of second silicon regions alternating with second silicon regions of the second set of second silicon regions.

A third aspect of the present invention is a junction varactor, comprising: a first silicon region formed in a silicon substrate, the first silicon region of a first dopant type; a plurality of second silicon regions formed on a top surface of the first silicon region, regions of the first silicon region under corresponding second silicon regions of the plurality of second silicon regions separated from each other by dielectric isolation formed in the first silicon region, the plurality of second silicon regions of a second dopant type, the first dopant type different from the second dopant type, opposing edges of adjacent second silicon regions of the plurality of second silicon regions overlapping respective same regions of the dielectric isolation; a cathode terminal electrically connected to said first silicon region; a first anode terminal electrically connected to a first set of second silicon regions of said plurality of second silicon regions; and a second anode terminal electrically connected to a second set of second silicon regions of the plurality of second silicon regions, second silicon regions of the first set of second silicon regions alternating with second silicon regions of the second set of second silicon regions.

A fourth aspect of the present invention is a method of fabricating a junction varactor, comprising: forming a single first silicon region in a silicon substrate, the first silicon region of a first dopant type; forming a plurality of second silicon regions in physical and electrical contact with the first silicon region, the plurality of second silicon regions spaced apart and not in physical contact with each other, the plurality of second silicon regions of a second dopant type, the first dopant type different from the second dopant type; forming a cathode terminal electrically connected to said first silicon region; forming a first anode terminal electrically connected to a first set of second silicon regions of said plurality of second silicon regions; and forming a second anode terminal electrically connected to a second set of second silicon regions of the plurality of second silicon regions, second silicon regions of the first set of second silicon regions alternating with second silicon regions of the second set of second silicon regions.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Unless otherwise noted, all N-type or P-type doped regions may be doped by ion implantation of a suitable dopant species followed by a heat treatment significantly above room temperature.

Figure 1A:
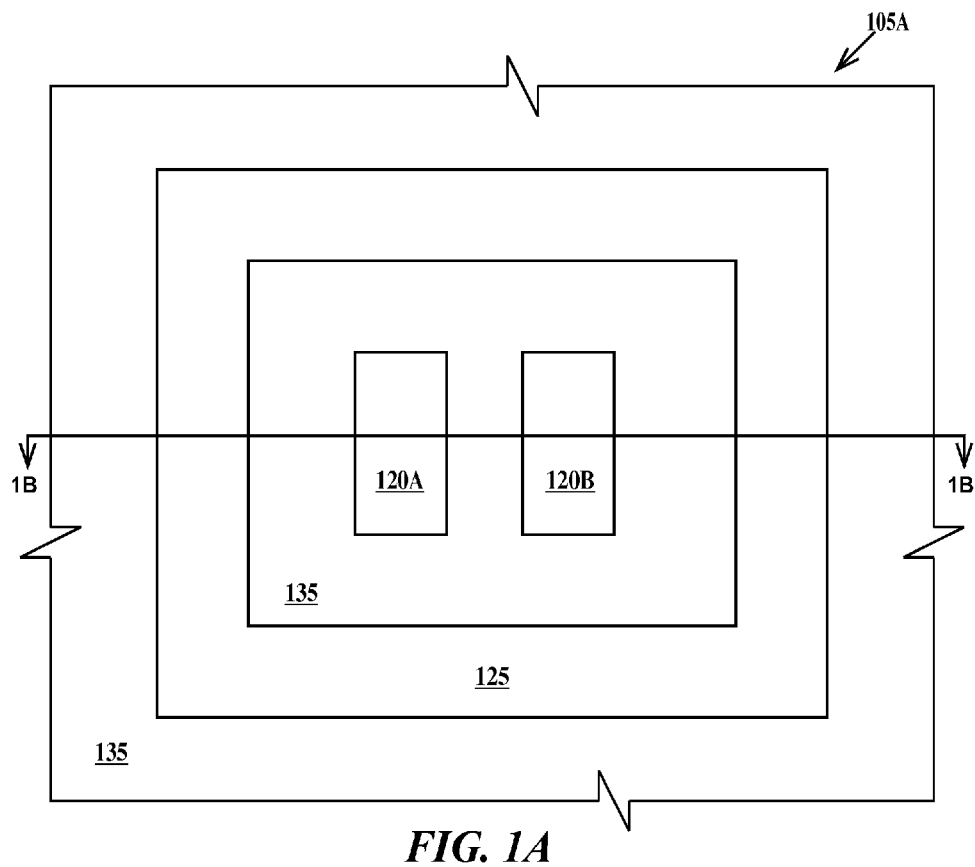
FIG. 1A is a top view and FIG. 1B is a cross-section through line 1B-1B of FIG. 1A of a substrate portion of a differential varactor according to a first embodiment of the present invention.
Figure 1B:
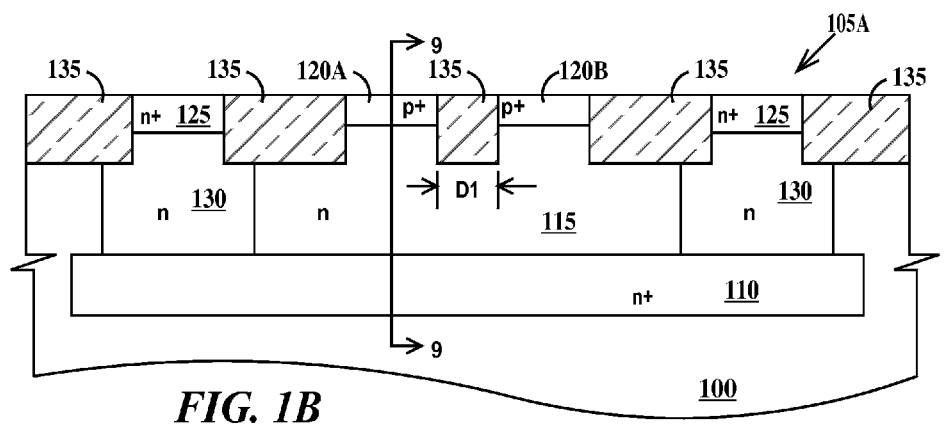

FIG. 1A is a top view and FIG. 1B is a cross-section through line 1B-1B of FIG. 1A of a substrate portion of a differential varactor according to a first embodiment of the present invention. In FIGS. 1A and 1B formed in a substrate 100 is a differential varactor body 105A. Varactor body 105A is a junction or diode varactor. Varactor body 105A comprises an N-type doped silicon buried cathode plate region 110, an N-type doped silicon graded cathode region 115 and first and second P-type doped silicon anodes 120A and 120B. First and second anodes 120A and 120B are not in physical contact with each other. Graded cathode region 115 is formed between buried cathode plate region 110 and first and second anodes 120A and 120B. In one example, cathode plate region 110 may not be a separate structure, but simply be the deeper end (i.e. furthest from the surface) of graded cathode region 115. First and second anodes 120A and 120B extend from a top surface of substrate 100 into graded cathode region 115. An N-type doped silicon cathode contact 125 is formed in an N-type doped silicon reach-through 130 which contacts buried cathode plate region 110. First and second anodes 120A and 120B are isolated from each other by regions of dielectric isolation 135. Cathode contact 125 is isolated from both first and second anodes 120A and 120B by regions of dielectric isolation 135 as well. Dielectric isolation 135 extends from the top surface of substrate 100 a distance greater than the distance first and second anodes 120A and 120B extend from the top surface of the substrate into the substrate.

In one example, substrate 100 is a single-crystal silicon substrate (e.g. bulk silicon substrate). In one example, substrate 100 is a silicon-on-insulator (SOI) substrate and varactor body 105A is formed in the silicon layer on the insulator layer of the SOI substrate. In one example dielectric isolation 135 is shallow trench isolation (STI) comprising a trench filled with one or more layers of dielectric material. In an STI process, a pattern is defined in a photoresist layer and either a trench etched directly into the substrate or first into a hardmask layer and then into the substrate after the photoresist is removed using the hardmask layer as a mask. A dielectric material is then deposited into the trenches to overfill the trenches and a chemical-mechanical polish performed to coplanarize a top surface of the STI with a top surface of the substrate (or hardmask layer). In one example, the trenches are plasma etched.

First and second anodes 120A and 120B are spaced apart a distance D1. In order to minimize the area of varactor body 105A, D1 may be selected to be equal to a minimum distance definable by the photolithographic/etch process used to define dielectric isolation regions 135. This minimum distance is defined by the minimum groundrule feature size printable by the photolithographic process plus the etch bias (if any) of a particular integrated circuit fabrication level.

Figure 9:
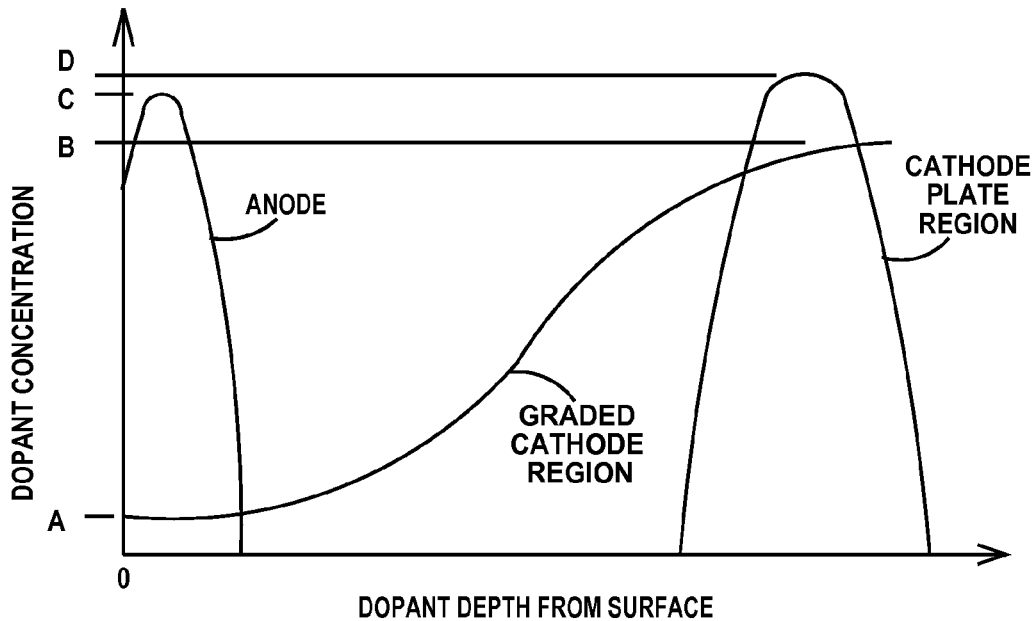
FIG. 9 is a dopant profile of the varactor of the first embodiment of the present invention through line 9-9 of FIG. 1B.

In one example, the peak concentration of N-type dopant of graded cathode region 115 decreases in the direction from buried cathode plate region 110 toward anodes 120A and 120B. In one example the peak concentration of P-type dopant in first and second anodes 120A and 120B is between about 1E20 atoms/cm$^3$ and about 1E21 atoms/cm$^3$. In one example the concentration of N-type dopant in graded cathode region 115 ranges from about 8E19 atoms/cm$^3$ or less at the surface of substrate 100 to about 1E11 atoms/cm$^3$ to about 1E20 atoms/cm$^3$ where graded cathode region 115 contacts cathode plate region 110. In one example the peak concentration of N-type dopant in cathode plate region 110 is between about 1E11 atoms/cm$^3$ and about 1E21 atoms/cm$^3$. In one example, the P-type dopant in first and second anodes 120A and 120 is boron. In one example, the N-type dopant in graded cathode region 115 is arsenic, antimony, phosphorous, or any combination of arsenic, antimony and phosphorous. In one example, the N-type dopant in buried cathode plate region 110 is arsenic, antimony, phosphorous, or any combination of arsenic, antimony and phosphorous. An example dopant profile of varactor body 105A through line 9-9 of FIG. 1B is illustrated in FIG. 9 and described infra.

Figure 2A:
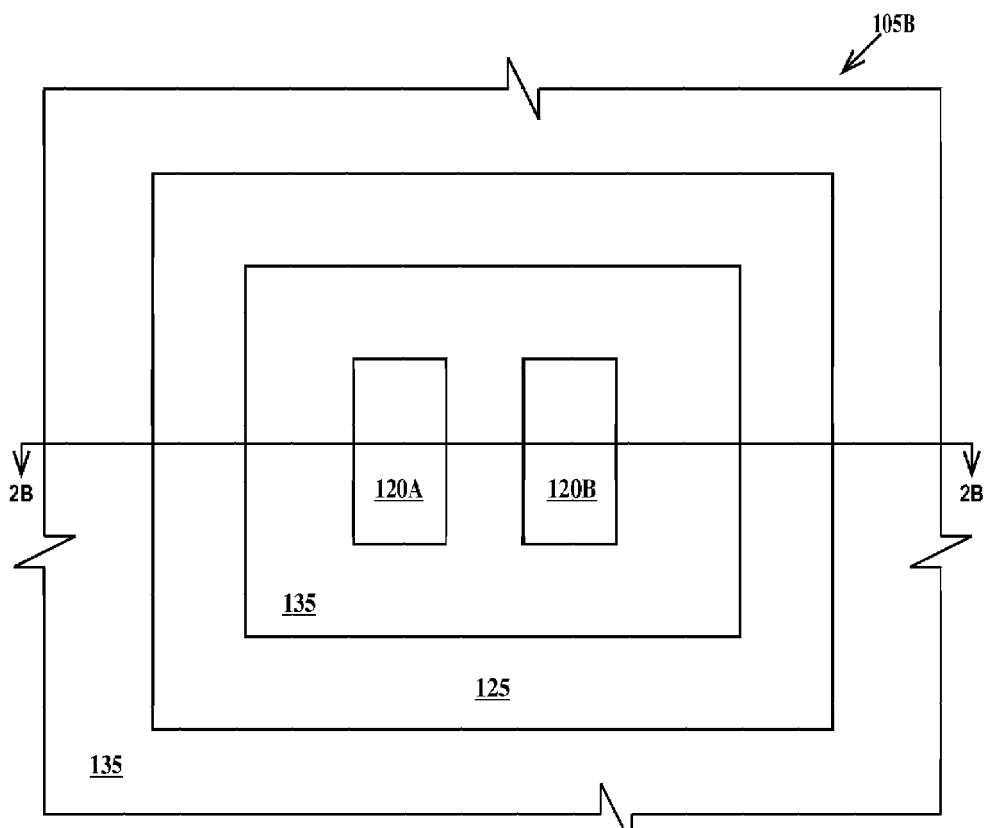
FIG. 2A is a top view and FIG. 2B is a cross-section through line 2B-2B of FIG. 2A of a substrate portion of a differential varactor according to a second embodiment of the present invention.
Figure 2B:
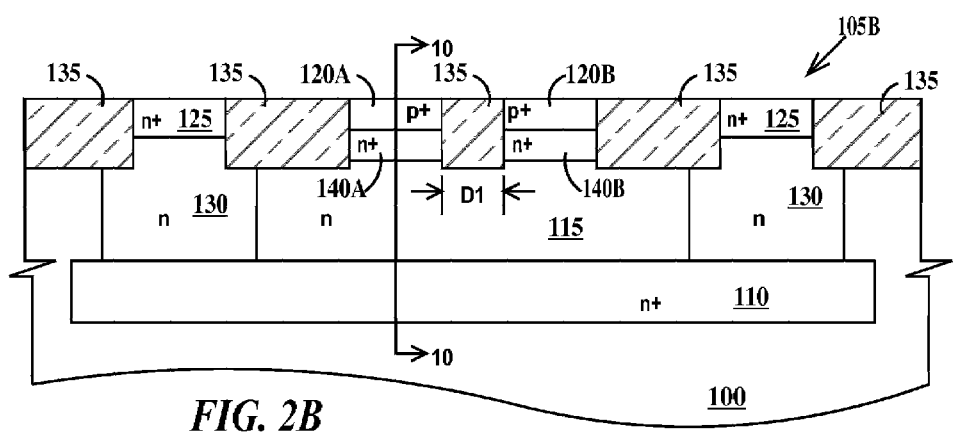

FIG. 2A is a top view and FIG. 2B is a cross-section through line 2B-2B of FIG. 2A of a substrate portion of a differential varactor according to a second embodiment of the present invention. In FIGS. 2A and 2B a differential varactor body 105B is a differential hyper-abrupt junction varactor (differential HAVAR). Differential varactor body 105B is similar to varactor body 105A of FIGS. 1A and 1B except for the addition of an N-type doped silicon first abrupt cathode region 140A between first anode 120A and graded cathode region 115 and an N-type doped silicon second abrupt cathode region 140B between second anode 120B and graded cathode region 115. In one example, dielectric isolation 135 extends from the top surface of substrate 100 into the substrate below first and second abrupt cathode regions 140A and 140B, thus isolating first abrupt cathode region 140A from second abrupt cathode region 140B.

Figure 10:
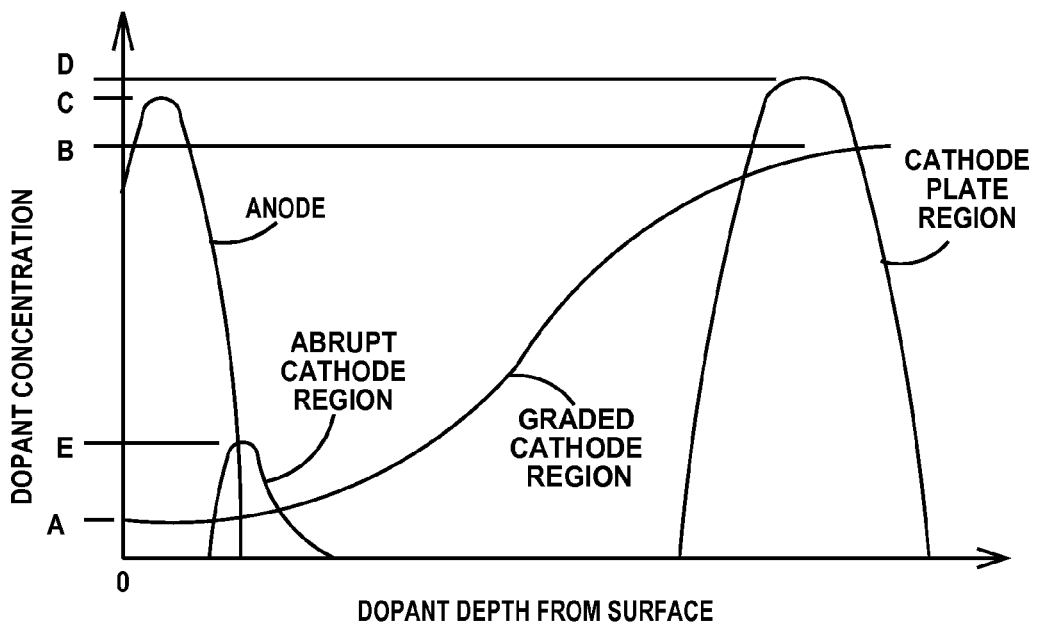
FIG. 10 is a dopant profile of the varactor of the second and third embodiments of the present invention through line 10-10 of FIGS. 2B and 3B.

In one example the peak concentration of N-type dopant in first and second abrupt cathode regions 140A and 140B is between about 1E11 atoms/cm$^3$ and about 1E19 atoms/cm$^3$. In one example, the N-type dopant in first and second abrupt cathode regions 140A and 140B is arsenic, antimony, phosphorous, or a combination thereof. An example dopant profile of varactor body 105B through line 10-10 of FIG. 2B is illustrated in FIG. 10 and described infra.

Analysis of physical differential HAVAR devices according to the second embodiment of the present invention showed an improvement in Quality (Q) factor of up to about 80% in the range of about 10 GHz to about 80 GHz compared to differentially wired pair of conventional HAVARs.

Figure 3A:
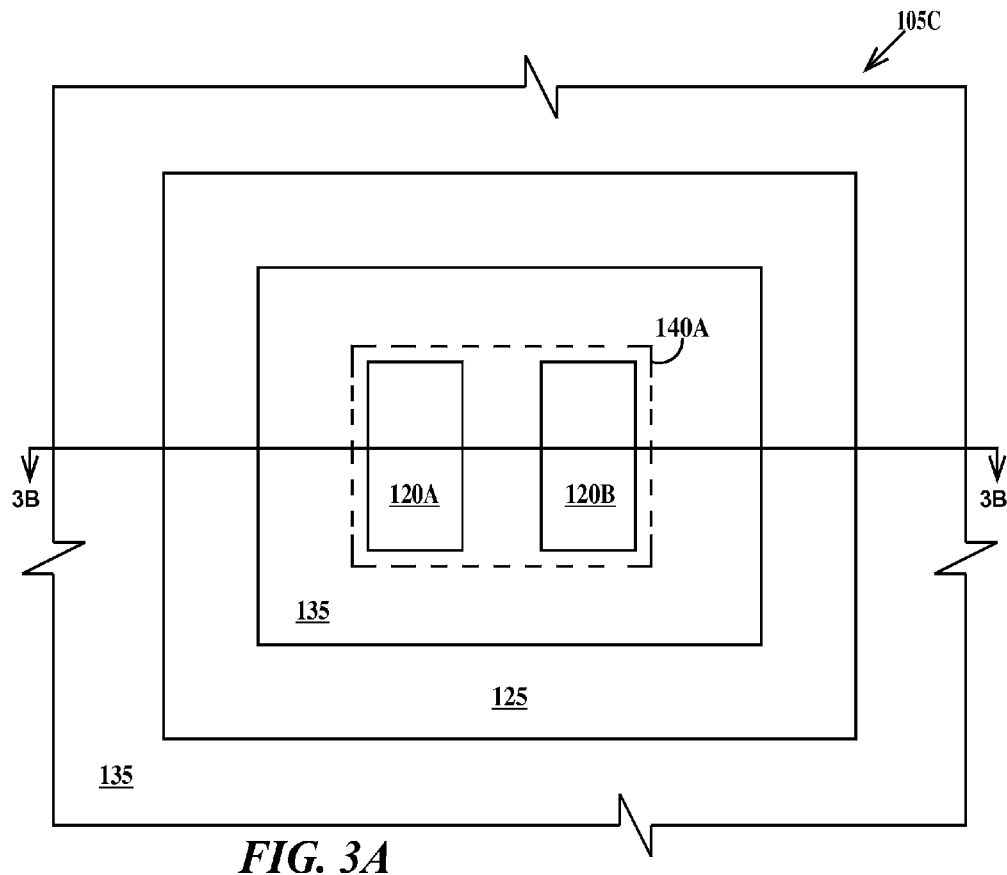
FIG. 3A is a top view and FIG. 3B is a cross-section through line 3B-3B of FIG. 3A of a substrate portion of a differential varactor according to a third embodiment of the present invention.
Figure 3B:
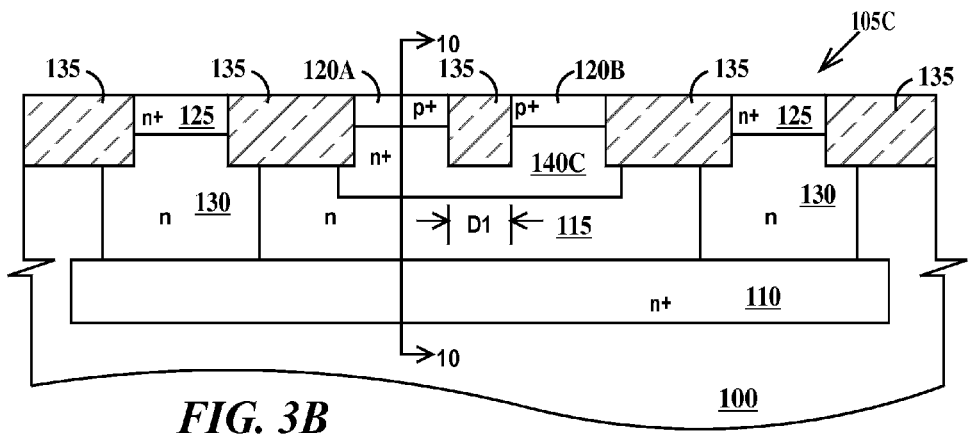

FIG. 3A is a top view and FIG. 3B is a cross-section through line 3B-3B of FIG. 3A of a substrate portion of a differential varactor according to a third embodiment of the present invention. FIGs. 3A and 3B are similar to FIGs. 2A and 2B except first and second abrupt cathode regions 140A and 140B of FIG. 2B are replaced by a single abrupt cathode region 140C under both first and second anodes 120A and 120B and the dielectric isolation between them. Dielectric isolation 135 extends into but not through abrupt cathode junction region 140C.

Figure 4A:
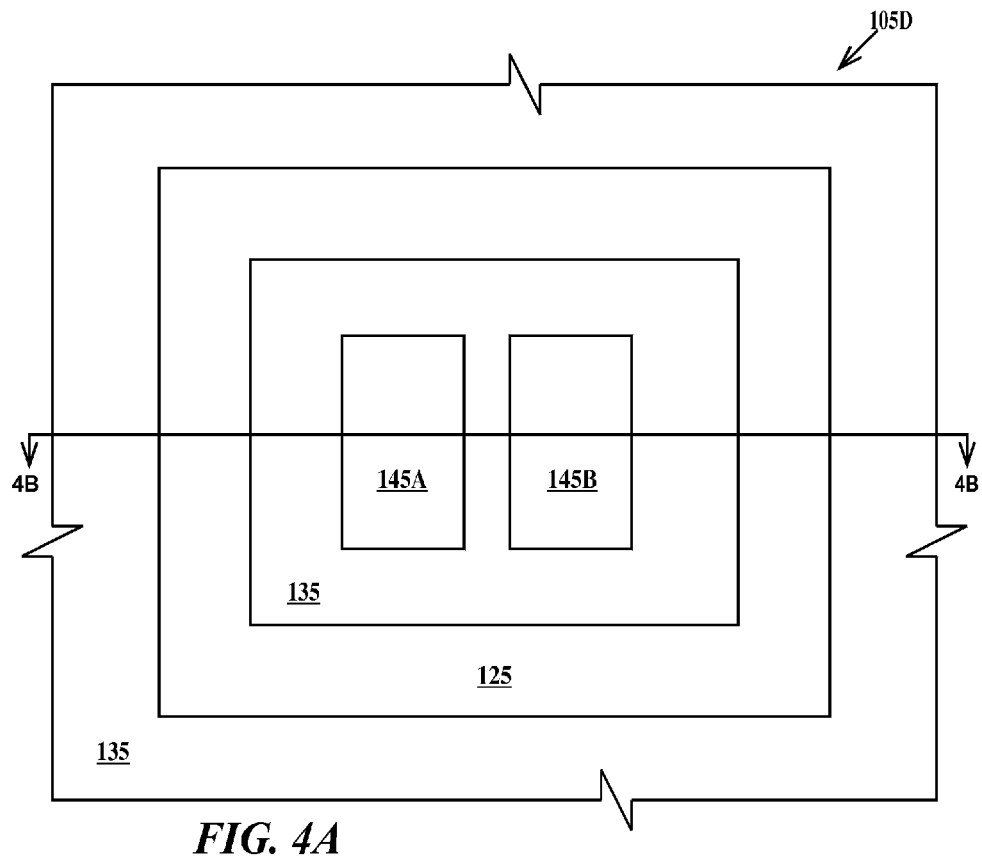
FIG. 4A is a top view and FIG. 4B is a cross-section through line 4B-4B of FIG. 4A of a substrate portion of a differential varactor according to a third embodiment of the present invention.
Figure 4B:
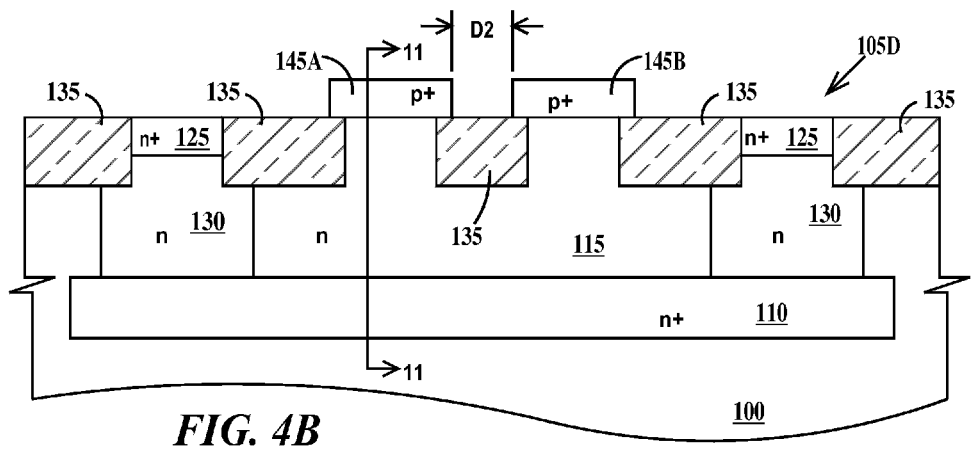

FIG. 4A is a top view and FIG. 4B is a cross-section through line 4B-4B of FIG. 4A of a substrate portion of a differential varactor according to a fourth embodiment of the present invention. In FIG. 4A and 4B, a differential varactor body 105D is similar to varactor body 105A of FIGS. 1A and 1B except for the location of P-type doped silicon first and second anodes 145A and 145B which replace first and second anodes 120A and 120B of FIGS. 1A and 1B. First and second anodes 145A and 145B are not in physical contact with each other. First and second anodes 145A and 145B are formed on the top surface of substrate 100 and graded cathode region 115 extends to the top surface of substrate 100 and contacts first and second anodes 145A and 145B.

Figure 11:
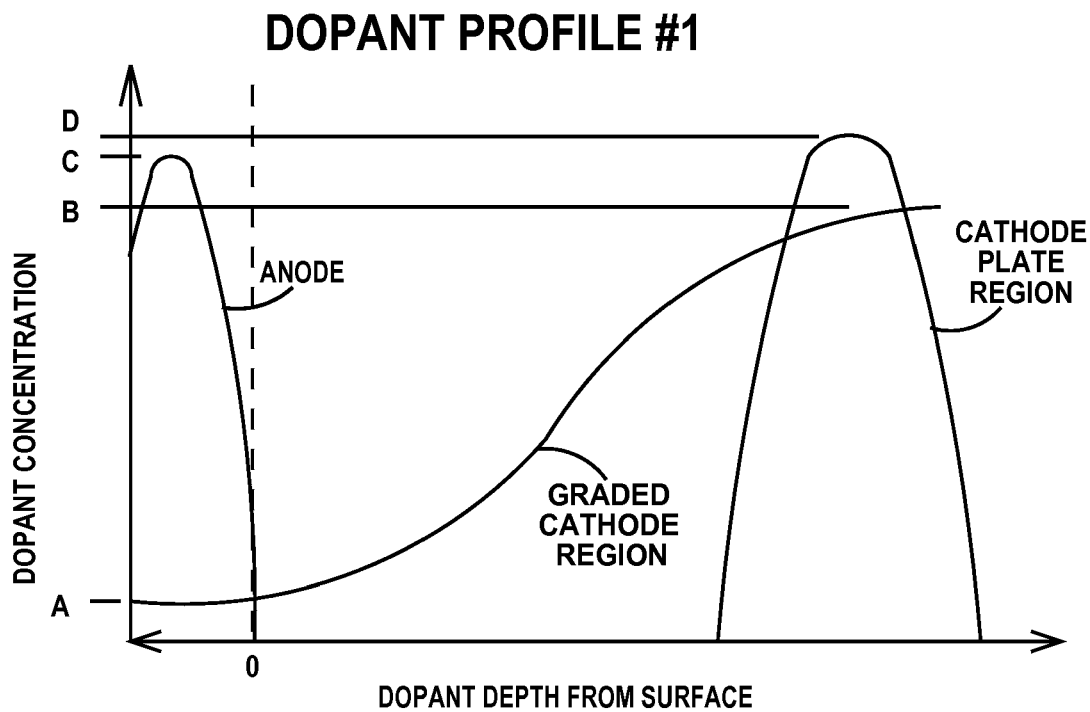
FIG. 11 is a dopant profile of the varactor of the fourth and fifth embodiment of the present invention through line 11-11 of FIGS. 4B and 5B.

Though the junctions between first and second anodes 145A and 145B and graded cathode 115 are shown at the surface of substrate 100, the actual location of the PN-junction between the anodes and the graded cathode region may occur above or below the plane defined by the top surface of substrate 100. The dopant profile of varactor 105D is illustrated in FIG. 11 and described infra.

In one example, first and second anodes 145A and 145B are formed by epitaxial deposition of undoped or P-type (e.g. boron) doped silicon to form a silicon layer, followed by photolithographic and etch steps. If undoped silicon is formed, then P-type (e.g. boron) ion implantation may be performed in the epitaxial layer prior to etching the silicon layer. First and second anodes 145A and 145B are spaced apart a distance D2. In order to minimize the area of varactor body 105D, D2 may be selected to be equal to the minimum distance definable by the photolithographic/etch process used to define first and second anodes 145A and 145B.

Figure 5A:
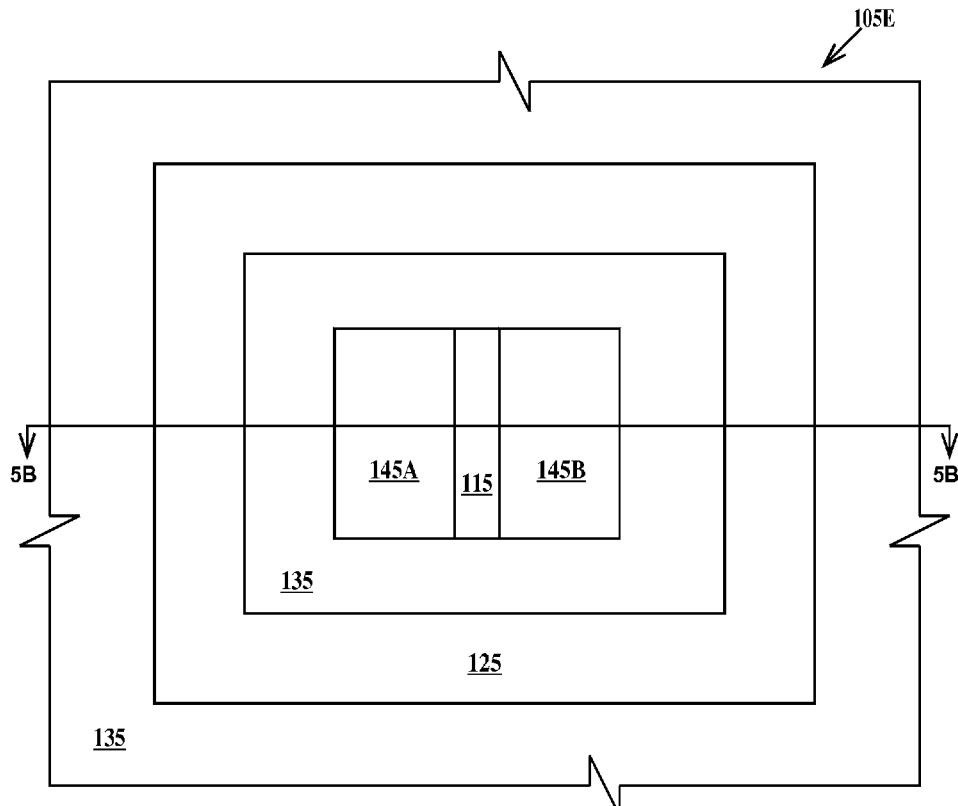
FIG. 5A is a top view and FIG. 5B is a cross-section through line 5B-5B of FIG. 5A of a substrate portion of a differential varactor according to a fifth embodiment of the present invention.
Figure 5B:
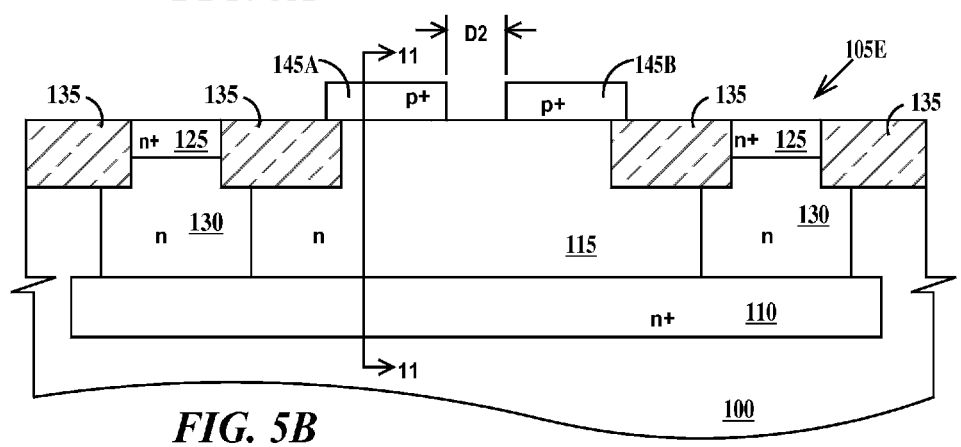

FIG. 5A is a top view and FIG. 5B is a cross-section through line 5B-5B of FIG. 5A of a substrate portion of a differential varactor 105E according to a fifth embodiment of the present invention. FIGS. 5A and 5B are similar to FIGS. 4A and 4B except there is no dielectric isolation between first and second anodes 145A and 145B.

Figure 6A:
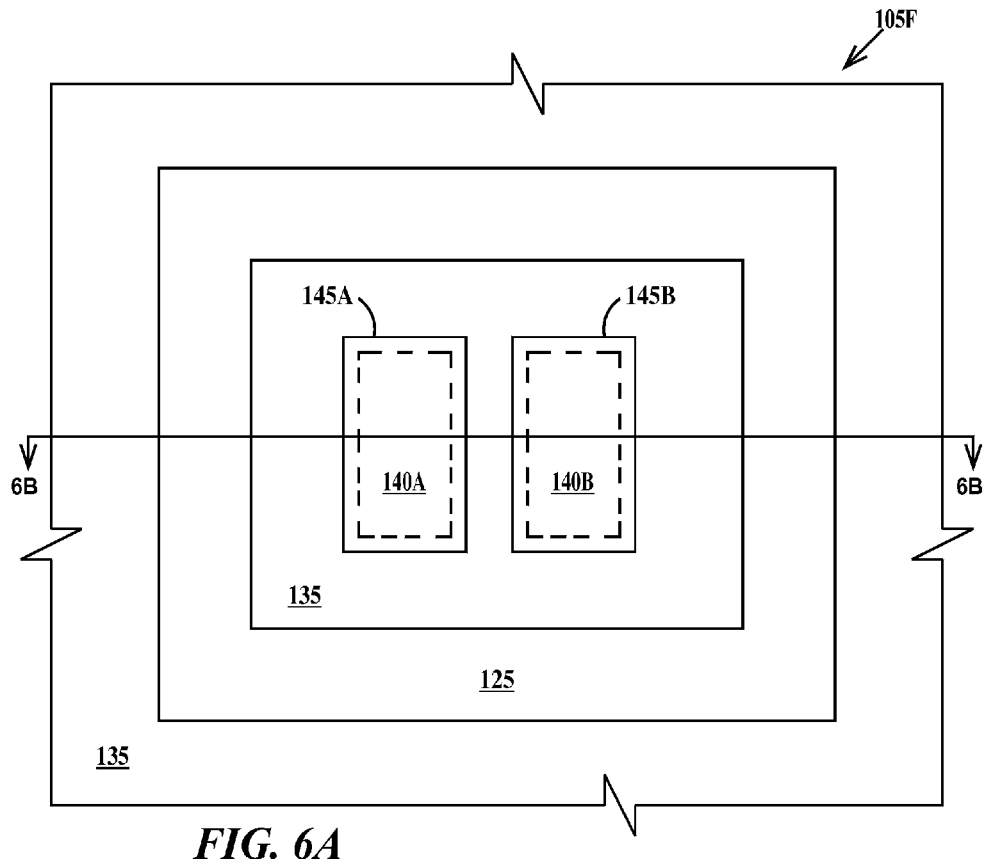
FIG. 6A is a top view and FIG. 6B is a cross-section through line 6B-6B of FIG. 6A of a substrate portion of a differential varactor according to a sixth embodiment of the present invention.
Figure 6B:
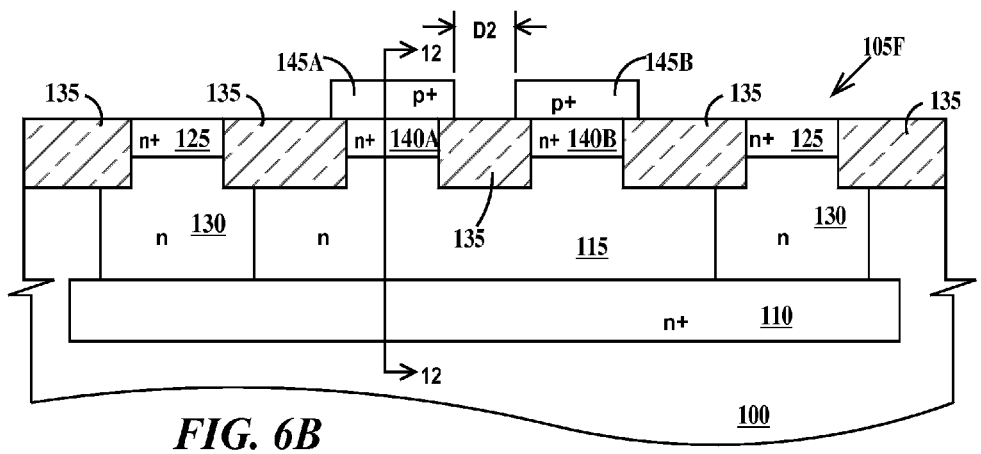
Figure 12:
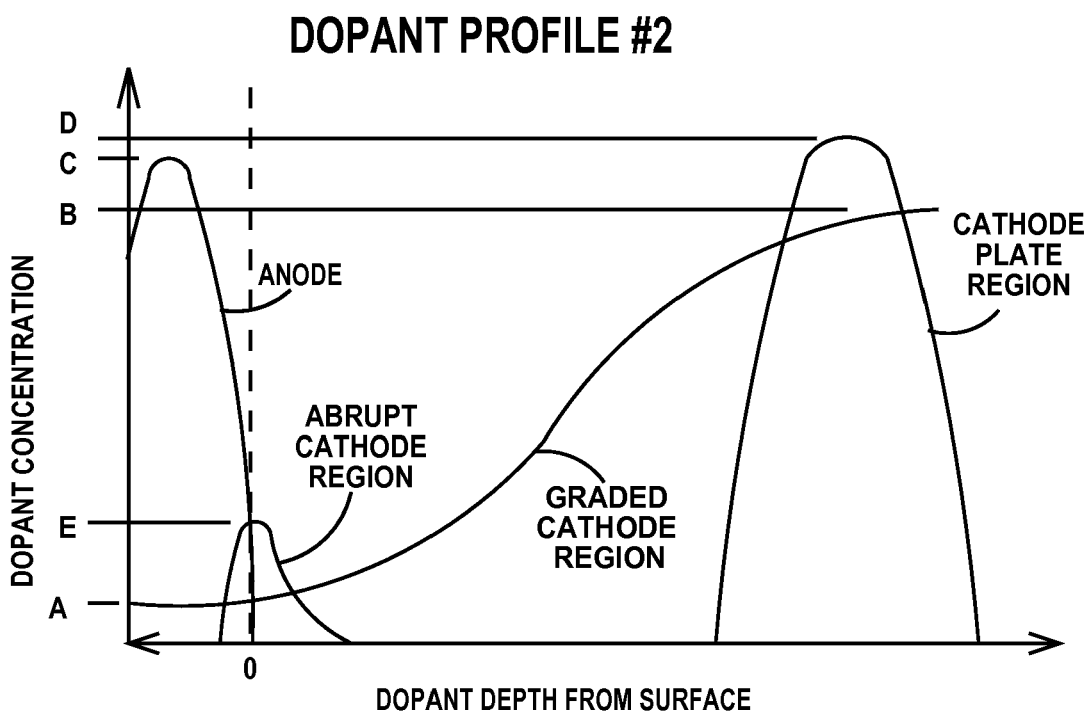
FIG. 12 is a dopant profile of the varactor of the sixth and seventh embodiments of the present invention through line 12-12 of FIGS. 7B and 8B.

FIG. 6A is a top view and FIG. 6B is a cross-section through line 6B-6B of FIG. 6A of a substrate portion of a differential varactor according to a sixth embodiment of the present invention. In FIGS. 6A and 6B a differential varactor body 105F is a differential hyper-abrupt junction varactor (differential HAVAR). Differential varactor body 105F is similar to varactor body 105D of FIGS. 4A and 4B except for the addition of first abrupt region 140A (described supra) between first anode 145A and graded cathode region 115 and second abrupt region 140B (described supra) between second anode 145B and graded cathode region 115. In one example, dielectric isolation 135 extends from the top surface of substrate 100 into the substrate below abrupt cathode regions 140A and 140B, thus isolating first abrupt cathode region 140A from second abrupt cathode region 140B. In another example, dielectric isolation 135 extends from the top surface of substrate 100 but not completely through the first and second abrupt cathode regions 140A and 140B, thus leaving a connection between the first abrupt cathode region 140A and second abrupt cathode region 140B. The dopant profile of varactor 105F is illustrated in FIG. 12 and described infra.

In one example the peak concentration of P-type dopant (e.g. boron) in first and second anodes 145A and 145B is between about 1E20 atoms/cm$^3$ and about 1E21 atoms/cm$^3$. Though first abrupt cathode regions 140A and 140B are shown as contacting corresponding first and second anodes 145A and 145B at the surface of substrate 100, the actual location of the PN-junctions between the anodes and the abrupt cathode regions may occur above or below the plane defined by the top surface of substrate 100.

Figure 7A:
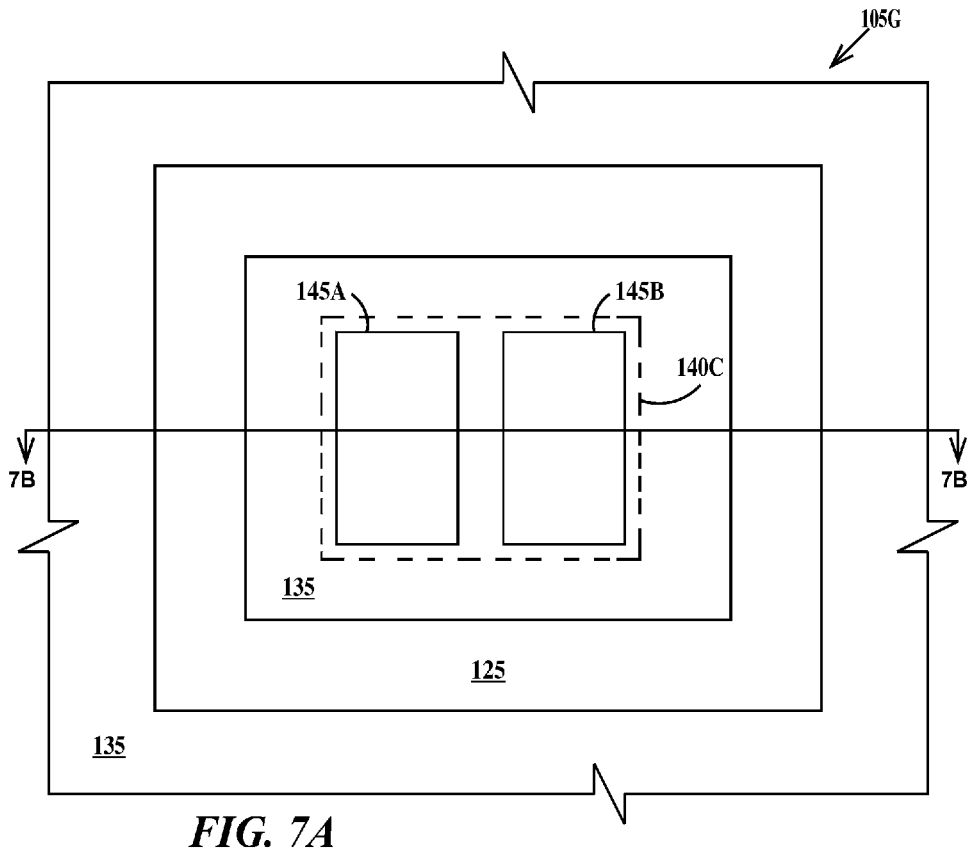
FIG. 7A is a top view and FIG. 7B is a cross-section through line 7B-7B of FIG. 7A of a substrate portion of a differential varactor according to a seventh embodiment of the present invention.
Figure 7B:
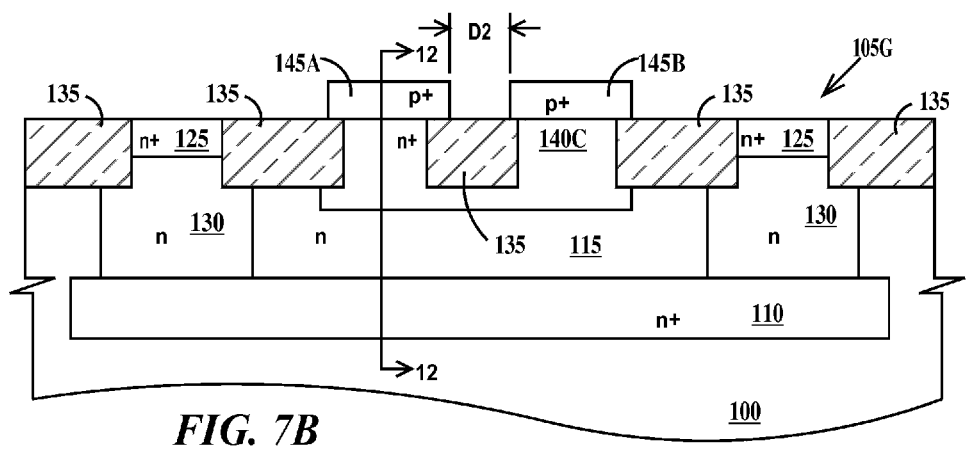

FIG. 7A is a top view and FIG. 7B is a cross-section through line 7B-7B of FIG. 7A of a substrate portion of a differential varactor according to a seventh embodiment of the present invention. FIGS. 7A and 7B are similar to FIGS. 6A and 6B except first and second abrupt cathode regions 140A and 140B of FIG. 2B are replaced by a single abrupt anode 140C under both first and second anodes 145A and 145B and the dielectric isolation between them. Dielectric isolation 135 extends into but not through abrupt cathode junction region 140C. The dopant profile of varactor 105G is similar to that illustrated in FIG. 12 and described infra.

Figure 8A:
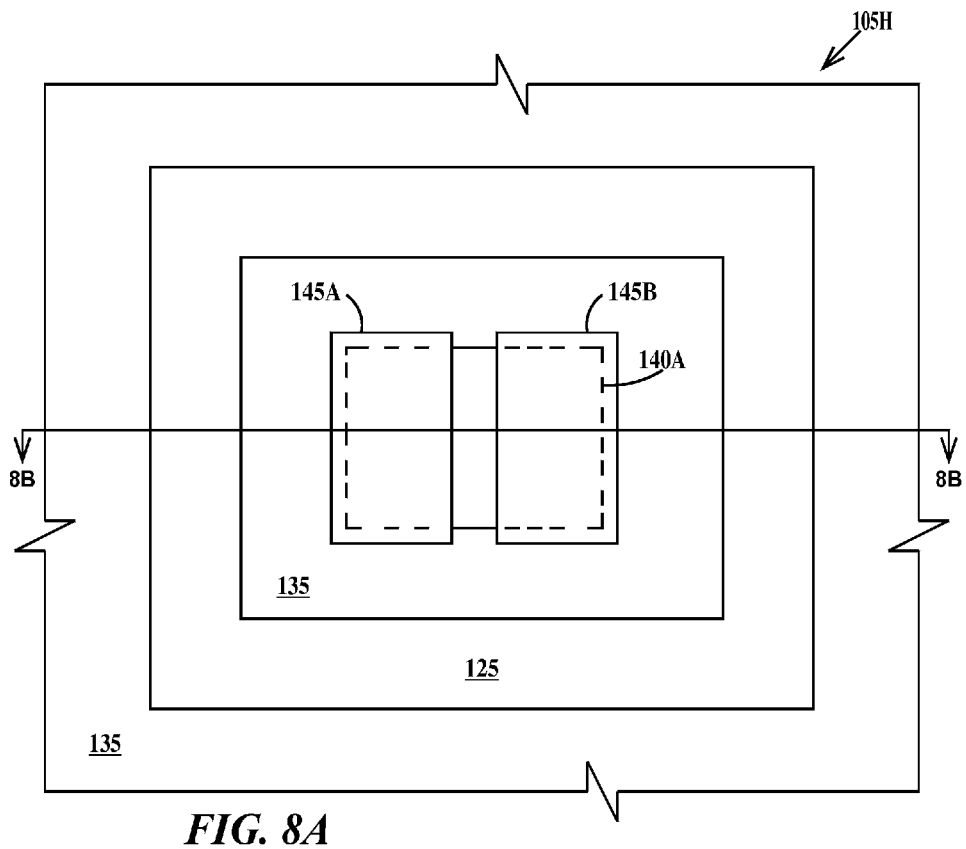
FIG. 8A is a top view and FIG. 8B is a cross-section through line 8B-8B of FIG. 8A of a substrate portion of a differential varactor according to an eighth embodiment of the present invention.
Figure 8B:
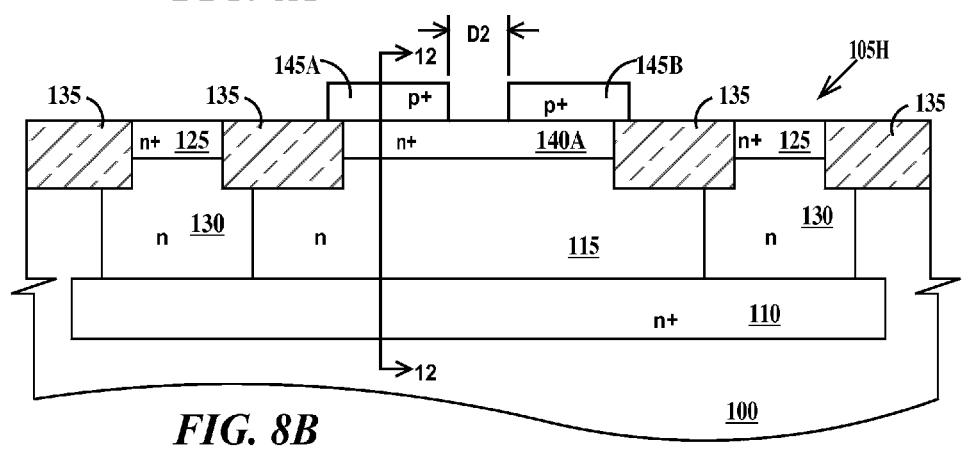

FIG. 8A is a top view and FIG. 8B is a cross-section through line 8B-8B of FIG. 8A of a substrate portion of a differential varactor according to an eighth embodiment of the present invention. FIGS. 8A and 8B are similar to FIGS. 6A and 6B except first and second abrupt cathode regions 140A and 140B of FIG. 6B are replaced by a single abrupt anode 140C under both first and second anodes 145A and 145B an there is no dielectric isolation between the anodes.

FIG. 9 is a dopant profile of the varactor of the first embodiment of the present invention through line 9-9 of FIG. 1B. In FIG. 9, the anode, graded cathode region and cathode plate region are formed by separate doping processes (e.g. ion implantation, each of which may include or more doping steps). In one example, cathode plate region may not be a separate structure, but simply be the deeper end of the graded cathode region profile and formed in the same process sequence as the graded cathode region. In one example the peak concentration (reference C) of P-type dopant in anode(s) is between about 1E20 atoms/cm$^3$ and about 1E21 atoms/cm$^3$. In one example the concentration of N-type dopant in the graded cathode region ranges from about 8E19 atoms/cm$^3$ or less at the surface of the substrate (reference A) to about 1E11 atoms/cm$^3$ to about 1E20 atoms/cm$^3$ where the graded cathode region contacts the cathode plate region (reference B). In one example the peak concentration (reference D) of N-type dopant in the cathode plate region is between about 1E11 atoms/cm$^3$ and about 1E21 atoms/cm$^3$.

FIG. 10 is a dopant profile of the varactor of the second and third embodiments of the present invention through line 10-10 of FIGS. 2B and 3B. FIG. 10. is similar to FIG. 9, except the profile of abrupt cathode region(s) is shown. In one example the peak concentration (reference E) of N-type dopant in the abrupt cathode region(s) is between about 1E11 atoms/cm$^3$ and about 1E19 atoms/cm$^3$. The abrupt cathode region is separately formed from the other regions.

FIG. 11 is a dopant profile of the varactor of the fourth and fifth embodiments of the present invention through line 11-11 of FIGS. 4B and 5B. FIG. 11 is similar to FIG. 9 except the surface of the substrate is approximately marked by the dashed line and can shift small distances (e.g. about +/−20% of the thickness of anodes 145A and 145B, see FIG. 4B) along the X-axis (the axis in the plane of the top surface of the substrate).

FIG. 12 is a dopant profile of the varactor of the sixth and seventh embodiments of the present invention through line 12-12 of FIGS. 6B, 7B and 8B. FIG. 12 is similar to FIG. 10 except the surface of the substrate is approximately marked by the dashed line and can shift small distances (e.g. about +/−20% of the thickness of anodes 145A and 145B, see FIG. 6B) along the X-axis.

In FIGS. 13A, 13B, 14A and 14B, the exemplary varactors are illustrated using varactor body 105A illustrated in FIGS. 1A and 1B and described supra. However, varactor body 105B of FIGS. 2A and 2B, varactor body 105C of FIGS. 3A and 3B, varactor body 105D of FIGS. 4A and 4B, varactor body 105E of FIGS. 5A and 5B, varactor body 105F of FIGS. 6A and 6B, varactor body 105G of FIGS. 7A and 7B and varactor body 105H of FIGS. 8A and 8B may be substituted for varactor body 105A.

Figure 13A:
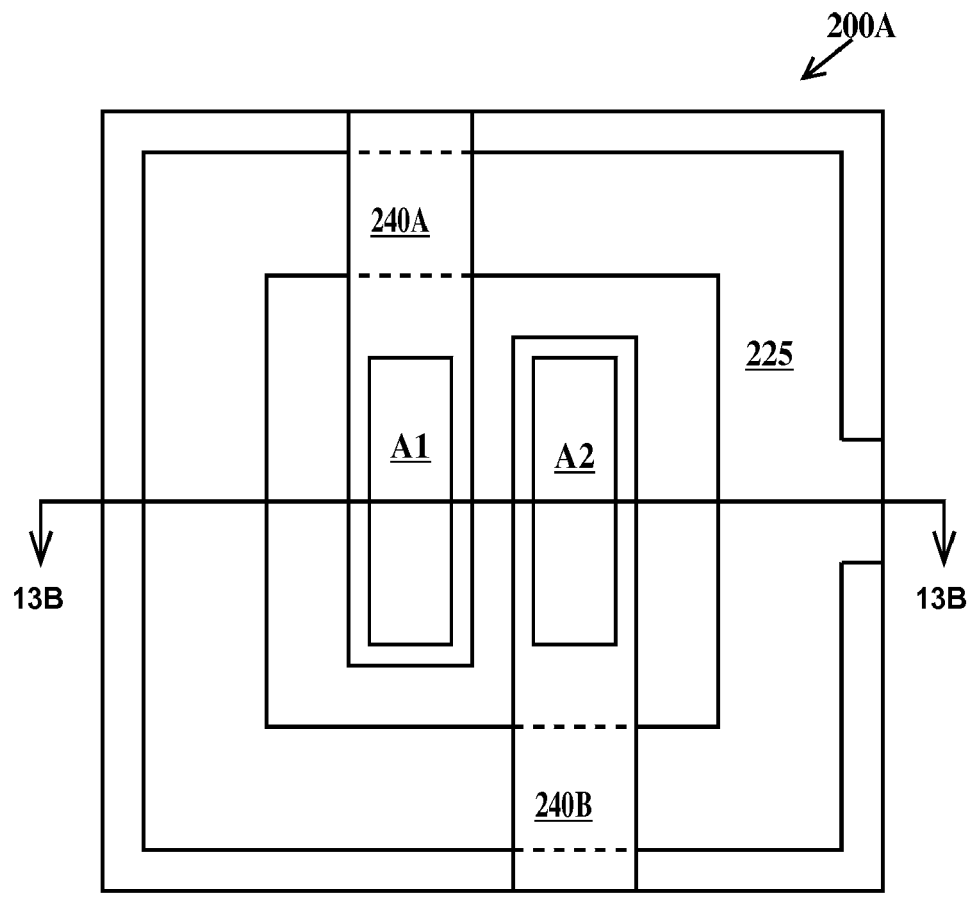
FIG. 13A is a top view and FIG. 13B is a cross-section through line 13B-13B of FIG. 13A of an exemplary differential varactor according to embodiments of the present invention.
Figure 13B:
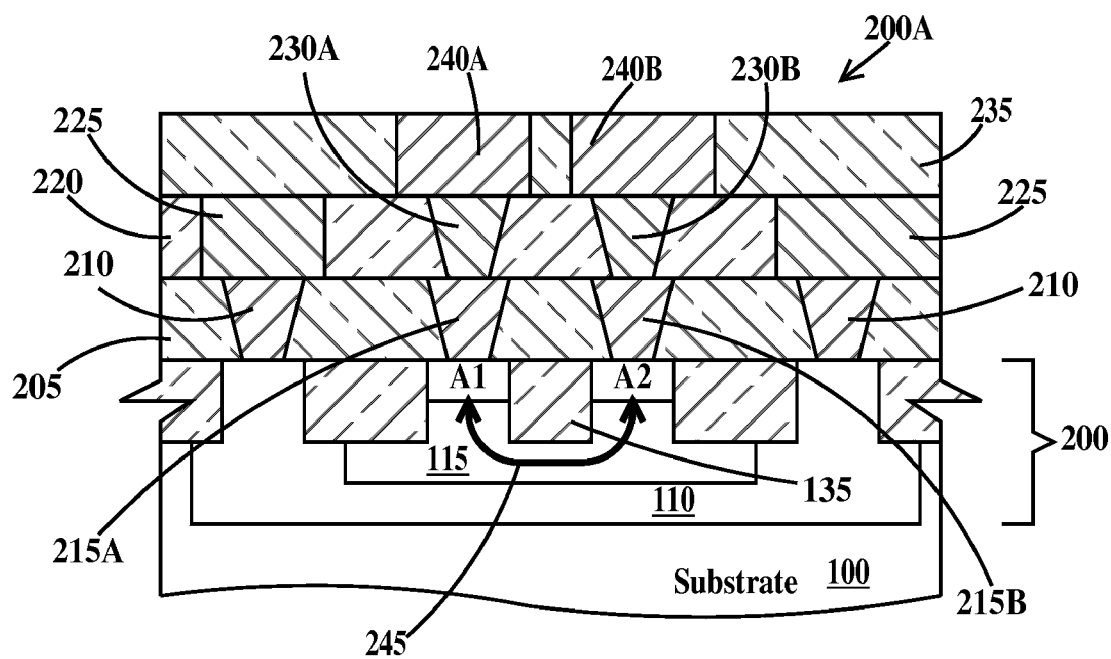

FIG. 13A is a top view and FIG. 13B is a cross-section through line 13B-13B of FIG. 13A of an exemplary differential varactor according to embodiments of the present invention. FIGS. 13A and 13B illustrate a varactor with two doped silicon anodes.

In FIGS. 13A and 13B a varactor 200A includes varactor body 105A that includes buried cathode plate region 110, graded cathode region 115 and doped silicon anodes A1 and A2 (doped silicon anodes 120A and 120B of FIGS. 1A and 1B). Formed on top of substrate 100 is a first dielectric layer 205 including electrically conductive contacts 210 to buried cathode plate region 110 and electrically conductive contacts 215A and 215B to respective doped silicon anodes Al and A2. Formed on top of first dielectric layer 205 is a second dielectric layer 220 including a cathode terminal wire 225 physically and electrically connected to contacts 210 and further including contacts 230A and 230B physically and electrically connected to respective contacts 215A and 215B. Formed on top of second dielectric layer 220 is a third dielectric layer 238 including a first anode terminal wire 240A physically and electrically connected to contact 230A and a second anode terminal wire 240B physically and electrically connected to contact 230B.

Because doped silicon anodes Al and A2 are formed in the same graded cathode region 115 and may be separated a minimum distance definable by the photolithographic/etch process used to define dielectric isolation regions 135 the current path 248 between doped silicon anodes Al and A2 is minimized as well as the overall substrate surface area used by varactor 200A. Both of these factors contribute to a significant increase in the Q-factor of varactor 200A compared to differentially wired pair of conventional HAVARs.

Figure 14A:
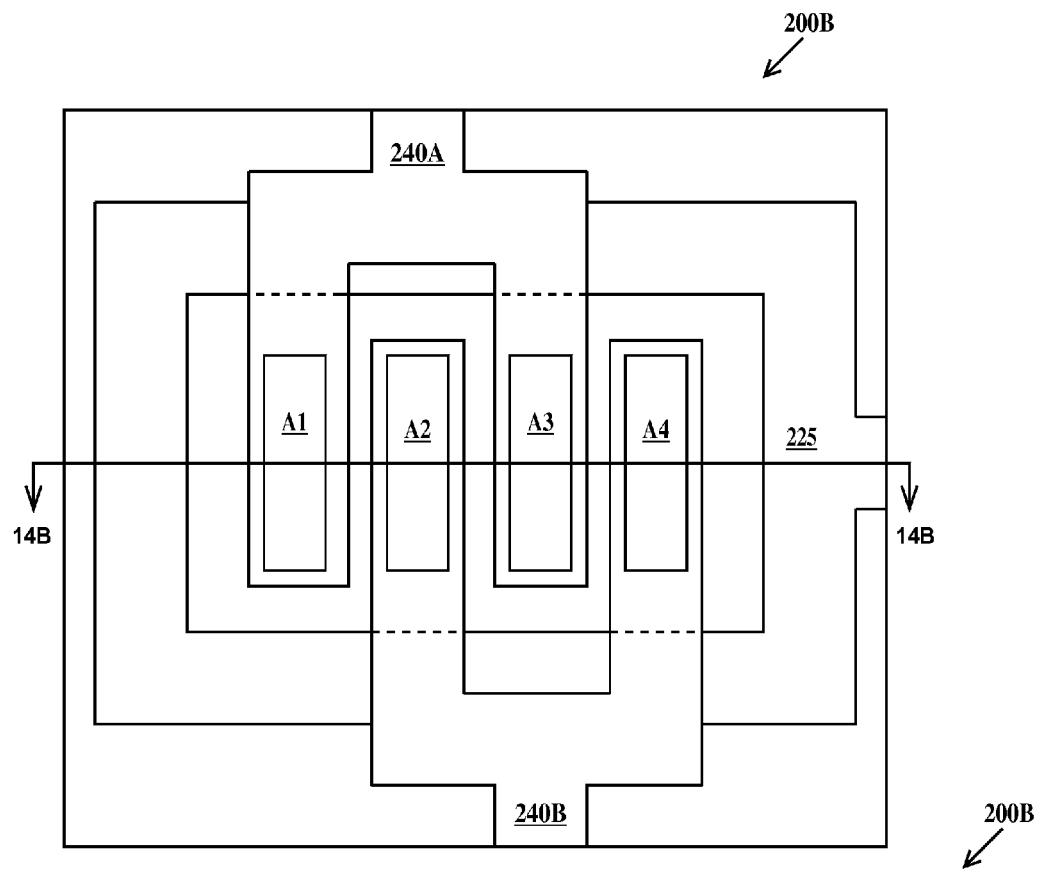
FIG. 14A is a top view and FIG. 14B is a cross-section through line 14B-14B of FIG. 14A of an exemplary differential varactor according to embodiments of the present invention.
Figure 14B:
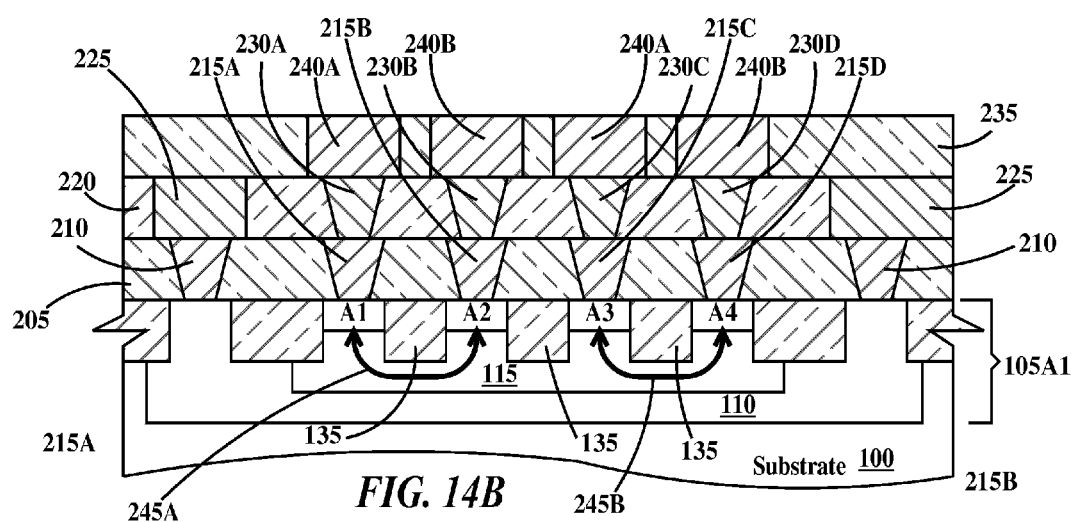

FIG. 14A is a top view and FIG. 14B is a cross-section through line 14B-14B of FIG. 14A of an exemplary differential varactor according to embodiments of the present invention. FIGS. 14A and 14B illustrate a varactor with four doped silicon anodes.

In FIGS. 14A and 14B a varactor 200B includes varactor body 105A1 that includes buried cathode plate region 110, graded cathode region 115 and doped silicon anodes A1, A2, A3 and A4 (similar to doped silicon anodes 120A and 120B of FIGS. 1A and 1B). Formed on top of substrate 100 is a first dielectric layer 205 including electrically conductive contacts 210 to buried cathode plate region 110 and electrically conductive contacts 215A, 215B, 215C and 215D to respective doped silicon anodes A1, A2, A3 and A4. Formed on top of first dielectric layer 205 is a second dielectric layer 220 including a cathode terminal wire 225 physically and electrically connected to contacts 210 and further including contacts 230A, 230B, 230C and 230D physically and electrically connected to respective contacts 215A, 215B, 215C and 215D. Formed on top of second dielectric layer 220 is a third dielectric layer 238 including a first anode terminal wire 240A physically and electrically connected to contact 230A and 230C and a second anode terminal wire 240B physically and electrically connected to contacts 230B and 230C.

Because doped silicon anodes A1 and A2 (and A3 and A4) are formed in the same graded cathode region 115 and may be separated a minimum distance definable by the photolithographic/etch process used to define dielectric isolation regions 135 the current paths 245A between doped silicon anodes A1 and A2 and 245B between doped silicon anodes A3 and A4 is minimized as well as the overall substrate surface area used by varactor 200B. Both of these factors contribute to a significant increase in the Q-factor of varactor 200B compared to differentially wired pairs of conventional HAVARs While two doped anodes A1 and A1 are illustrated in FIGS. 13A and 13B and four doped silicon anodes A1, A2, A3 and A4 are illustrated in FIGS. 14A and 14B, the number of anodes in FIGS. 13A and 13B and 14A and 14B may be considered exemplary and varactors according to the embodiments of the present invention may have two or more doped silicon anodes. The specific wiring illustrated in FIGS. 12A, 12B, 14A and 14B should also be considered exemplarily and other wiring schemes known in the art may be used proved there is a cathode terminal and two junction isolate anode terminal.

Thus the present invention provides a single differential junction varactor having a common cathode, which consumes up to about 80% less integrated chip space than two conventional junction varactors wired together differentially.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, while each differential varactor has been described with two anodes, there may be three or more anodes. Therefore, it is intended that the following claims cover all such modifications and changes as fall within the true spirit and scope of the invention.

What is claimed is:

1. A junction varactor, comprising:
a single first silicon region formed in a silicon substrate, said first silicon region of a first dopant type, a concentration of dopant of said first dopant type in said first silicon region increasing with increasing distance into said substrate from a top surface of said silicon substrate;
a plurality of second silicon regions in physical and electrical contact with said first silicon region, said plurality of second silicon regions spaced apart and not in physical contact with each other, said plurality of second silicon regions of a second dopant type, said first dopant type different from said second dopant type, said second silicon regions isolated from direct electrical contact with each other by dielectric isolation regions formed in said substrate;
a buried plate in said silicon substrate, said first silicon region in contact with said buried plate, said first silicon region between said buried plate and said top surface of said silicon substrate, said buried plate doped said first dopant type;
a cathode terminal electrically connected to said first silicon region;
a first anode terminal electrically connected to a first set of second silicon regions of said plurality of second silicon regions; and
a second anode terminal electrically connected to a second set of second silicon regions of said plurality of second silicon regions, second silicon regions of said first set of second silicon regions alternating with second silicon regions of said second set of second silicon regions.

2. The varactor of claim 1, wherein said plurality of second silicon regions are formed in said first silicon region.

3. The varactor of claim 2, further including a plurality of third silicon regions formed in said first silicon region, each third silicon region of said plurality of third silicon regions in physical and electrical contact with a respective region of said plurality of second silicon regions, said third silicon regions completely separating respective second silicon regions from said first silicon region, said third silicon regions of said first dopant type; and wherein said dielectric isolation electrically isolates adjacent regions of said plurality of third silicon regions from each other.

4. The varactor of claim 2, further including a third silicon region formed in said first silicon region, said third silicon region in physical and electrical contact with each region of said plurality of second silicon regions, said third silicon region completely separating each region of said plurality of second silicon regions from said first silicon region, said third silicon region of said first dopant type; and wherein said dielectric isolation extends into and terminates with said third silicon region.

5. The varactor of claim 1, wherein said plurality of second silicon regions are formed on a top surface of said first silicon region, opposing edges of adjacent second silicon regions of said plurality of second silicon regions overlapping respective same regions of said dielectric isolation regions.

6. The varactor of claim 5, further including a plurality of third silicon regions formed in said first silicon region, each third silicon region of said plurality of third silicon regions in physical and electrical contact with a respective region of said plurality of second silicon regions, said third silicon regions completely separating respective second silicon regions from said first silicon region, said third silicon regions of said first dopant type; and wherein said dielectric isolation electrically isolates adjacent regions of said plurality of third silicon regions from each other.

7. The varactor of claim 5, further including a third silicon region formed in said first silicon region, said third silicon region in physical and electrical contact with each region of said plurality of second silicon regions, said third silicon region completely separating each region of said plurality of second silicon regions from said first silicon region, said third silicon region of said first dopant type and wherein said dielectric isolation extends into and terminates with said third silicon region.

8. A junction varactor, comprising:

a first silicon region formed in a silicon substrate, said first silicon region of a first dopant type, a concentration of dopant of said first dopant type in said first silicon region increasing with increasing distance into said substrate from a top surface of said silicon substrate;

a plurality of second silicon regions formed in said first silicon region, adjacent second silicon regions of said plurality of second silicon regions separated from each other by dielectric isolation formed in said first silicon region, said plurality of second silicon regions of a second dopant type, said first dopant type different from said second dopant type, said dielectric isolation extending into said first silicon region from a top surface of said substrate a first distance and said plurality of second silicon regions extending into said first silicon region from said top surface of said substrate a second distance, said first distance greater than said second distance;

a buried plate in said silicon substrate, said first silicon region in contact with said buried plate, said first silicon region between said buried plate and said top surface of said silicon substrate, said buried plate doped said first dopant type;

a cathode terminal electrically connected to said first silicon region;

a first anode terminal electrically connected to a first set of second silicon regions of said plurality of second silicon regions; and a second anode terminal electrically connected to a second set of second silicon regions of said plurality of second silicon regions, second silicon regions of said first set of second silicon regions alternating with second silicon regions of said second set of second silicon regions.

9. The varactor of claim 8, further including, a plurality of third silicon regions, each third silicon region of said plurality of third silicon regions between a respective second silicon region of said plurality of second silicon regions and said first silicon region, said plurality of third silicon regions of said first dopant type, adjacent third silicon regions of said plurality of third silicon regions separated from each other by said dielectric isolation, said third silicon regions contacting said first silicon region at a third distance from said top surface of said substrate, said third distance less than said first distance and greater than said second distance.

10. The varactor of claim 9, further including a third silicon region formed in said first silicon region, said third silicon region in physical and electrical contact with each region of said plurality of second silicon regions, said third silicon region completely separating each region of said plurality of second silicon regions from said first silicon region, said third silicon region of said first dopant type; and wherein said dielectric isolation extends into and terminates with said third silicon region.

11. A junction varactor, comprising:

a first silicon region formed in a silicon substrate, said first silicon region of a first dopant type;

a plurality of second silicon regions formed on a top surface of said first silicon region, regions of said first silicon region under corresponding second silicon regions of said plurality of second silicon regions separated from each other by dielectric isolation formed in said first silicon region, said plurality of second silicon regions of a second dopant type, said first dopant type different from said second dopant type, opposing edges of adjacent second silicon regions of said plurality of second silicon regions overlapping respective same regions of said dielectric isolation;

a cathode terminal electrically connected to said first silicon region;

a first anode terminal electrically connected to a first set of second silicon regions of said plurality of second silicon regions; and a second anode terminal electrically connected to a second set of second silicon regions of said plurality of second silicon regions, second silicon regions of said first set of second silicon regions alternating with second silicon regions of said second set of second silicon regions.

12. The varactor of claim 11, further including a corresponding plurality of third silicon regions formed in said first silicon regions under and in physical and electrical contact with respective second silicon regions of said plurality of second silicon regions, said plurality of third silicon regions of said first dopant type, adjacent third silicon regions of said plurality of third silicon regions separated from each other by said dielectric isolation, said dielectric isolation extending into said first silicon region from said top surface of said substrate a first distance, said third silicon regions extending into said first silicon region from said top surface of said substrate a second distance, said first distance greater than said second distance.

13. The varactor of claim 12, further including a third silicon region formed in said first silicon region, said third silicon region in physical and electrical contact with each region of said plurality of second silicon regions, said third silicon region completely separating each region of said plurality of second silicon regions from said first silicon region, said third silicon region of said first dopant type; and wherein said dielectric isolation extends into and terminates with said third silicon region.

14. A method of fabricating a junction varactor, comprising:

forming a single first silicon region in a silicon substrate, said first silicon region of a first dopant type, a concentration of dopant of said first dopant type in said first silicon region increasing with increasing distance into said substrate from a top surface of said silicon substrate;

forming a plurality of second silicon regions in physical and electrical contact with said first silicon region, said plurality of second silicon regions spaced apart and not in physical contact with each other, said plurality of second silicon regions of a second dopant type, said first dopant type different from said second dopant type;

forming a buried plate in said silicon substrate, said first silicon region in contact with said buried plate, said first silicon region between said buried plate and said top surface of said silicon substrate, said buried plate doped said first dopant type;

forming dielectric isolation regions in said substrate, said second silicon regions isolated from direct electrical contact with each other by said dielectric isolation regions;

forming a cathode terminal electrically connected to said first silicon region;

forming a first anode terminal electrically connected to a first set of second silicon regions of said plurality of second silicon regions; and forming a second anode terminal electrically connected to a second set of second silicon regions of said plurality of second silicon regions, second silicon regions of said first set of second silicon regions alternating with second silicon regions of said second set of second silicon regions.

15. The method of claim 14, wherein said plurality of second silicon regions are formed in said first silicon region.

16. The method of claim 15, further including forming a plurality of third silicon regions in said first silicon region, each third silicon region of said plurality of third silicon regions in physical and electrical contact with a respective region of said plurality of second silicon regions, said third silicon regions completely separating respective second silicon regions from said first silicon region, said third silicon regions of said first dopant type; and wherein said dielectric isolation electrically isolates adjacent regions of said plurality of third silicon regions from each other.

17. The method of claim 15, further including forming a third silicon region in said first silicon region, said third silicon region in physical and electrical contact with each region of said plurality of second silicon regions, said third silicon region completely separating each region of said plurality of second silicon regions from said first silicon region, said third silicon region of said first dopant type; and wherein said dielectric isolation extends into and terminates with said third silicon region.

18. The method of claim 14, wherein said plurality of second silicon regions are formed on a top surface of said first silicon region, opposing edges of adjacent second silicon regions of said plurality of second silicon regions overlapping respective same regions of said dielectric isolation regions.

19. The method of claim 18, further including forming a plurality of third silicon regions in said first silicon region, each third silicon region of said plurality of third silicon regions in physical and electrical contact with a respective region of said plurality of second silicon regions, said third silicon regions completely separating respective second silicon regions from said first silicon region, said third silicon regions of said first dopant type; and wherein said dielectric isolation electrically isolates adjacent regions of said plurality of third silicon regions from each other.

20. The method of claim 18, further including forming a third silicon region in said first silicon region, said third silicon region in physical and electrical contact with each region of said plurality of second silicon regions, said third silicon region completely separating each region of said plurality of second silicon regions from said first silicon region, said third silicon region of said first dopant type; and wherein said dielectric isolation extends into and terminates with said third silicon region.

21. The junction varactor of claim 1, wherein:

said buried plate is doped said first dopant type and a maximum concentration of dopant of said first dopant type in said buried plate is higher than a maximum concentration of dopant of said first dopant type in said first silicon region.

22. The junction varactor of claim 21, further including:

an annular contact in said silicon substrate, said annular contact doped said first dopant type and extending from said top surface of said silicon substrate to said buried plate cathode, said annular contact surrounding a perimeter of a region of said silicon substrate containing said plurality of second silicon regions, said annular contact separated from said plurality of second silicon regions by said dielectric isolation regions.

23. The method of claim 1, wherein top surfaces of said silicon substrate and said dielectric isolation regions are coplanar.

24. The method of claim 14, wherein:

said buried plate is doped said first dopant type and a maximum concentration of dopant of said first dopant type in said buried plate is higher than a maximum concentration of dopant of said first dopant type in said first silicon region.

25. The method of claim 24, further including:

forming an annular contact in said silicon substrate, said annular contact doped said first dopant type and extending from said top surface of said silicon substrate to said buried plate cathode, said annular contact surrounding a perimeter of a region of said silicon substrate containing said plurality of second silicon regions, said annular contact separated from said plurality of second silicon regions by said dielectric isolation regions.

26. The method of claim 14, wherein top surfaces of said silicon substrate and said dielectric isolation regions are coplanar.

* * * * *